United States Patent
Yu et al.

(10) Patent No.: US 11,450,562 B2
(45) Date of Patent: Sep. 20, 2022

(54) METHOD OF BOTTOM-UP METALLIZATION IN A RECESSED FEATURE

(71) Applicant: Tokyo Electron Limited, Tokyo (JP)

(72) Inventors: Kai-Hung Yu, Cohoes, NY (US); Jodi Grzeskowiak, Schenectady, NY (US); Nicholas Joy, Halfmoon, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 63 days.

(21) Appl. No.: 17/021,586

(22) Filed: Sep. 15, 2020

(65) Prior Publication Data

US 2021/0082750 A1   Mar. 18, 2021

Related U.S. Application Data (60) Provisional application No. 62/900,794, filed on Sep. 16, 2019.

(51) Int. Cl.
*H01L 21/768* (2006.01)

(52) U.S. Cl.
CPC .. *H01L 21/76843* (2013.01); *H01L 21/76865* (2013.01)

(58) Field of Classification Search
CPC ......... H01L 21/76843; H01L 21/76865; H01L 21/823871; H01L 23/53242; H01L 21/76877; H01L 2221/1063; H01L 23/535; H01L 21/743
See application file for complete search history.

(56) References Cited

U.S. PATENT DOCUMENTS

| 10,573,725 | B1* | 2/2020 | Huang .............. H01L 23/53257 |
| 2010/0210105 | A1 | 8/2010 | Baek et al. |
| 2017/0141199 | A1* | 5/2017 | Demuynck ....... H01L 21/02178 |
| 2018/0130707 | A1* | 5/2018 | Clendenning ..... H01L 29/66545 |
| 2019/0006230 | A1* | 1/2019 | Kuo ..................... H01L 23/5329 |
| 2019/0198389 | A1* | 6/2019 | Ren .................. H01L 21/76865 |
| 2019/0371735 | A1* | 12/2019 | van der Straten .......................... H01L 21/76846 |
| 2021/0066125 | A1* | 3/2021 | Li ........................... H01L 25/50 |

FOREIGN PATENT DOCUMENTS

| KR | 10-2012-0033640 A | 4/2012 |
| KR | 10-2017-0075459 A | 7/2017 |

OTHER PUBLICATIONS

International Search Report and Written Opinion dated Dec. 30, 2020 in PCT/US2020/050962, 10 pages.

\* cited by examiner

*Primary Examiner* — Julia Slutsker
(74) *Attorney, Agent, or Firm* — Oblon, McClelland, Maier & Neustadt, L.L.P.

(57) ABSTRACT

A method of metallization includes receiving a substrate having a recess formed therein. The recess has a bottom and sidewalls, and a conformal liner is deposited on the bottom and sidewalls of the recess. The conformal liner is removed from an upper portion of the recess to expose upper sidewalls of the recess while leaving the conformal liner in a lower portion of the recess covering the bottom and lower sidewalls of the recess. Metal is deposited in a lower portion of the recess to form a metallization feature including the conformal liner in the lower portion of the recess and the metal.

19 Claims, 11 Drawing Sheets

Increasing deposition time

METHOD OF BOTTOM-UP METALLIZATION IN A RECESSED FEATURE

INCORPORATION BY REFERENCE

This present disclosure claims the benefit of U.S. Provisional Application No. 62/900,794, filed on Sep. 16, 2019, which is incorporated herein by reference in its entirety.

FIELD OF THE INVENTION

This disclosure relates to the design and micro-fabrication of semiconductor devices.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to bottom-up metallization in a recessed structure.

A first aspect is a method of metallization which includes receiving a substrate having a recess formed therein, the recess having a bottom and sidewalls, and depositing a conformal liner on the bottom and sidewalls of the recess. The conformal liner is removed from an upper portion of the recess to expose upper sidewalls of the recess while leaving the conformal liner in a lower portion of the recess covering the bottom and lower sidewalls of the recess. Metal is selectively deposited in the lower portion of the recess to form a metallization feature including the conformal liner in the lower portion of the recess and the metal.

According to the first aspect, the conformal liner can be removed by depositing a material to cover the conformal liner in the lower portion of the recess, and selectively etching the conformal liner from the upper portion of the recess relative to the material covering the conformal liner in the lower portion of the recess. Then depositing a material can be either a metal that will form a portion of the metallization feature in the lower portion of the recess, or depositing a blocking material that will not form a portion of the metallization feature in the lower portion of the recess. The first aspect can further include surface treating the exposed upper sidewalls of the recess with a self-aligning monolayer to facilitate selective deposition of the metal relative to the exposed sidewalls.

According to another aspect, a method of processing a substrate is disclosed, where a substrate can be received with a patterned first layer defining a recessed feature that defines a bottom and sidewalls. The substrate can also include a second layer below the first layer, and the first layer can have the recessed feature extending into the second layer. The second layer can be any semiconductor material, such as silicon, and the first layer can be a dielectric material, such as silicon oxide.

The method can further include depositing a liner film on the substrate to conformally line uncovered surfaces, performing an initial metal deposition process that deposits relatively more metal on lower portions of sidewalls of the recessed feature as compared to upper portions of sidewalls of the recessed feature, recessing the initial metal deposition to a predetermined depth within the recessed feature resulting in a recessed metal deposition, and removing uncovered portions of the liner film from the substrate.

Subsequently, the same metal material can be selectively deposited on the recessed metal deposition. The selective metal deposition can fill gaps in the recessed metal deposition. The selective metal deposition process can also change a cross-sectional profile of the recessed metal deposition by reducing concavity of the cross-sectional profile. In some embodiments, a self-assembled monolayer that reduces metal nucleation on the first layer can be deposited on uncovered portions of the first layer, followed by a metal deposition process where the metal material can be selectively deposited on the recessed metal deposition. In an alternative embodiment, a self-assembled monolayer that serves as a precursor for metal nucleation can be deposited over the recessed metal deposition, followed by a metal deposition process where the metal material can be selectively deposited on the recessed metal deposition.

Further, the method can include cleaning the substrate to remove metal that is non-selectively deposited on uncovered portions of the first layer.

According to a second aspect, a method of processing a substrate is disclosed, where a substrate can be received with a patterned first layer defining a recessed feature that defines a bottom and sidewalls. The substrate can also include a second layer below the first layer, and the first layer can have the recessed feature extending into the second layer. The second layer can be any semiconductor material, such as silicon, and the first layer can be a dielectric material, such as silicon oxide.

The method can further include depositing a liner film on the substrate to conformally line uncovered surfaces, filling the recessed feature with a fill material, recessing the fill material to a predetermined depth with remaining fill material covering a portion of the liner film, and removing uncovered portions of the liner film from the substrate so that the remaining liner film lines the bottom and portions of sidewalls of the recessed feature. The remaining fill material can then be removed to leave the remaining liner film uncovered.

Subsequently, a metal material can be selectively deposited over the remaining liner film. In some embodiments, a self-assembled monolayer that reduces metal nucleation on the first layer can be deposited on uncovered portions of the first layer, followed by a metal deposition process where the metal material can be selectively deposited on the remaining liner film. In an alternative embodiment, a self-assembled monolayer that serves as a precursor for metal nucleation can be deposited over the remaining liner film, followed by a metal deposition process where the metal material can be selectively deposited on the remaining liner film.

Further, the method can include cleaning the substrate to remove metal that is non-selectively deposited on uncovered portions of the first layer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, semiconductor device fabricators have expressed a desire for three-dimensional (3D) semiconductor circuits in which transistors are stacked on top of each other. 3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Figure 9:
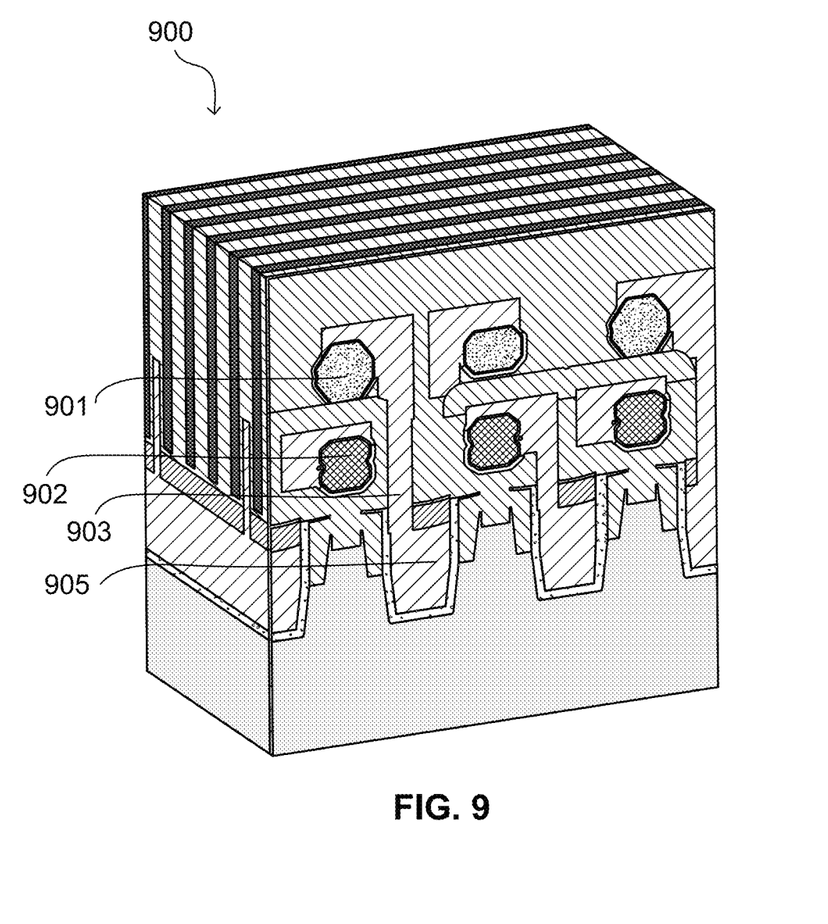
FIG. 9 is a cross-sectional view of an example buried power rail in a semiconductor device, as an exemplary application of the present disclosure.

Particularly, buried power rails are a scaling booster that supports the enablement of complimentary field-effect transistor (CFET) devices. CFET devices are three-dimensionally stacked logic standard cells in which either NMOS or PMOS is positioned overtop its compliment. A buried power rail is a power rail for a transistor cell that is positioned below a transistor plane, while conventional power rails are formed above FETs to connect to standard cells. FIG. 9 is a cross-sectional view of an example buried power rail in a semiconductor device 900, as an exemplary application of the present disclosure. The view shows a cross-section through a source/drain region of upper transistors, as well as a cross-section (in a different vertical plane) through a gate region of lower transistors. The device 900 can be used as a new kind of AOI CFET standard cell. The device 900 can have a plurality of source/drain regions 901, gate regions 902, metal filled regions 903, and buried power rails 905. The metal filled region 903 can electrically connect source/drain regions 901 to buried power rails 905. By burying the power rail in the bulk silicon of a device, a significant area scaling benefit is achieved through track-height reduction. The present disclosure relates to bottom-up methods of metallization of semiconductor device features, which may be used for fabricating buried power rails.

Figure 10A:
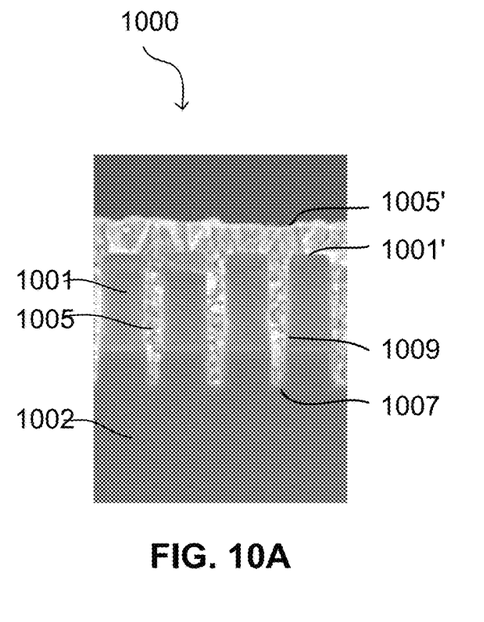
FIGS. 10A, 10B, and 10C are cross-sectional views of a semiconductor device at various intermediate steps of a traditional rail metallization process.
Figure 10B:
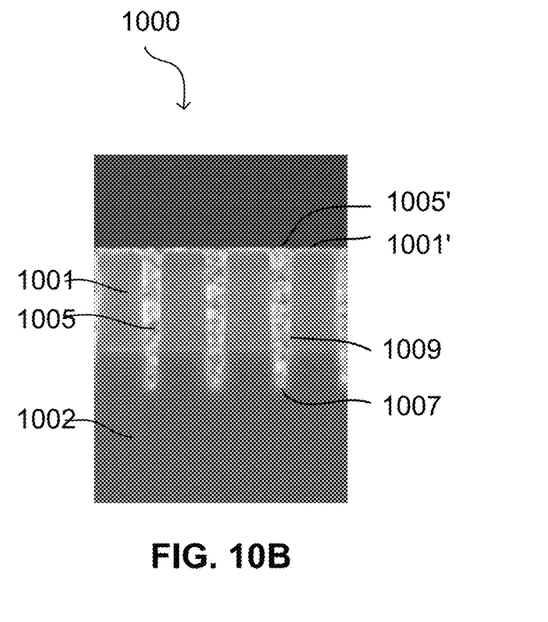
Figure 10C:
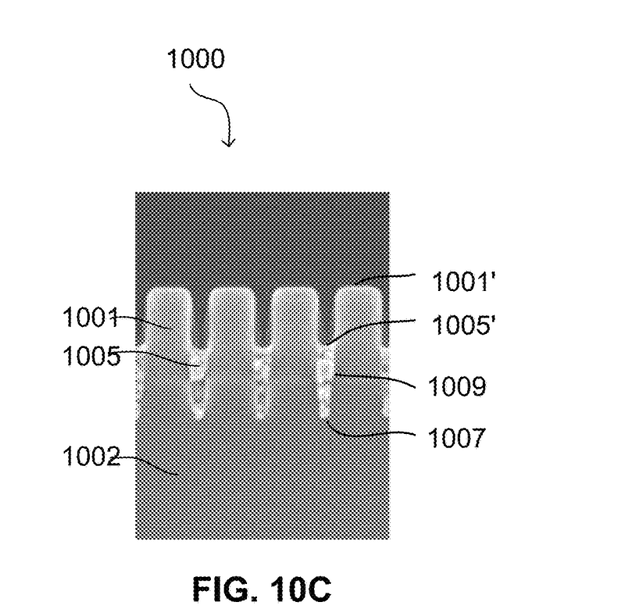

One technique of forming a buried power rail is to deposit a liner in a trench and completely fill the trench with an overburden of metal. A chemical-mechanical polishing process is then used to remove the overburden of metal. A reactive ion etch process can then be executed to recess metal in the trench to a desired depth. FIGS. 10A, 10B, and 10C are cross-sectional views of a semiconductor device 1000 at various intermediate steps of a traditional rail metallization process. As shown in FIG. 10A, the device 1000 includes a patterned first layer 1001 and a second layer 1002 below the patterned first layer 1001. The patterned first layer 1001 has a recessed feature that extends into the second layer 1002 and defines a bottom 1007 and two sidewalls 1009. The device 1000 can also have a liner film lining all surfaces, including bottoms 1007 and sidewalls 1009 of the recessed feature and top surfaces 1001' of the first layer 1001 (not visible due to scale). The device 1000 further includes a metal film 1005 over the liner film. The metal film 1005 can have a thickness so that the metal film 1005 completely fills the gaps of the recessed feature, and so that a top surface 1005' of the metal film 1005 is above the top surface 1001' of the first layer 1001. The second layer 1002 is silicon (and may be silicon bulk material), and the first layer 1001 is a silicon oxide. The recessed feature can be formed by directional etching using an etch mask to define regions to etch. In the example shown, the metal film 1005 is ruthenium, and deposited by chemical vapor deposition or atomic layer deposition.

FIG. 10B shows the device 1000 of FIG. 10A after a chemical mechanical planarization (CMP) process. As seen, the metal film 1005 is planarized so that the top surface 1005' of the metal film 1005 is on a same level as the top surface 1001' of the first layer 1001.

FIG. 10C shows the device 1000 in FIG. 10B after a reactive ion etching (RIE) process. The metal film 1005 is etched so that the top surface 1005' of the metal film 1005 is below the top surface 1001' of the first layer 1001. Consequently, the remaining metal film 1005 can cover the bottom 1007 and portions of sidewalls 1009 of the recessed feature.

The present inventors recognized that the traditional metallization process of FIGS. 10A, 10B and 10C is not preferred. For example, CMP processing can be expensive and RIE etching ruthenium can be slow. The inventors further recognized that one way to eliminate a need for CMP and lengthy etches is to metallize the rail in a bottom-up progression. In particular, the inventors recognized that advantages of bottom-up deposition can address some of the challenges encountered with buried power rail formation according to traditional CMP processes as described above. For example, forming buried power rails (or other trench metallization) can result in height variability from rail to rail. Moreover, profile control of the top of a metal rail is challenging. Inability to effectively address these two challenges can have a detrimental impact on the electrical performance of a corresponding device. For example, height variability contributes to varying capacitance between the power rail and an over-hanging contact, which can disrupt or delay device performance. Further, it is desirable for a top of the rail to have a flat topography. If instead the rail had a meniscus, then the result would be high electric fields at the peaks, which can cause device failure through electrostatic discharge (ESD). Additionally, a meniscus profile can compound the variability in distance between the top of the rail and the metallization above.

Techniques herein provide a method for bottom-up fill metallization using selective deposition. Techniques herein include removing a liner deposited during metallization. By removing the liner, the metal can then be deposited in a bottom-up progression. Some example techniques disclosed herein provide methods to pattern and form buried power rails, which can include depositing metals without chemical-mechanical polishing, such as ruthenium or cobalt that can be etched relative to dielectric material. In an exemplary embodiment, a bottom-heavy metal deposition can be recessed, and then completed via selective deposition. In one example embodiment, a self-assembled monolayer that coats dielectric material and replaces liner material focuses metal deposition within a bottom and portions of sidewalls of a trench. In an alternative embodiment, a liner film conformally lining the substrate can be selectively removed to cover only a bottom and portions of sidewalls of a trench. Subsequently, a metal deposition can be performed to selectively deposit metal on the liner material.

Figure 1:
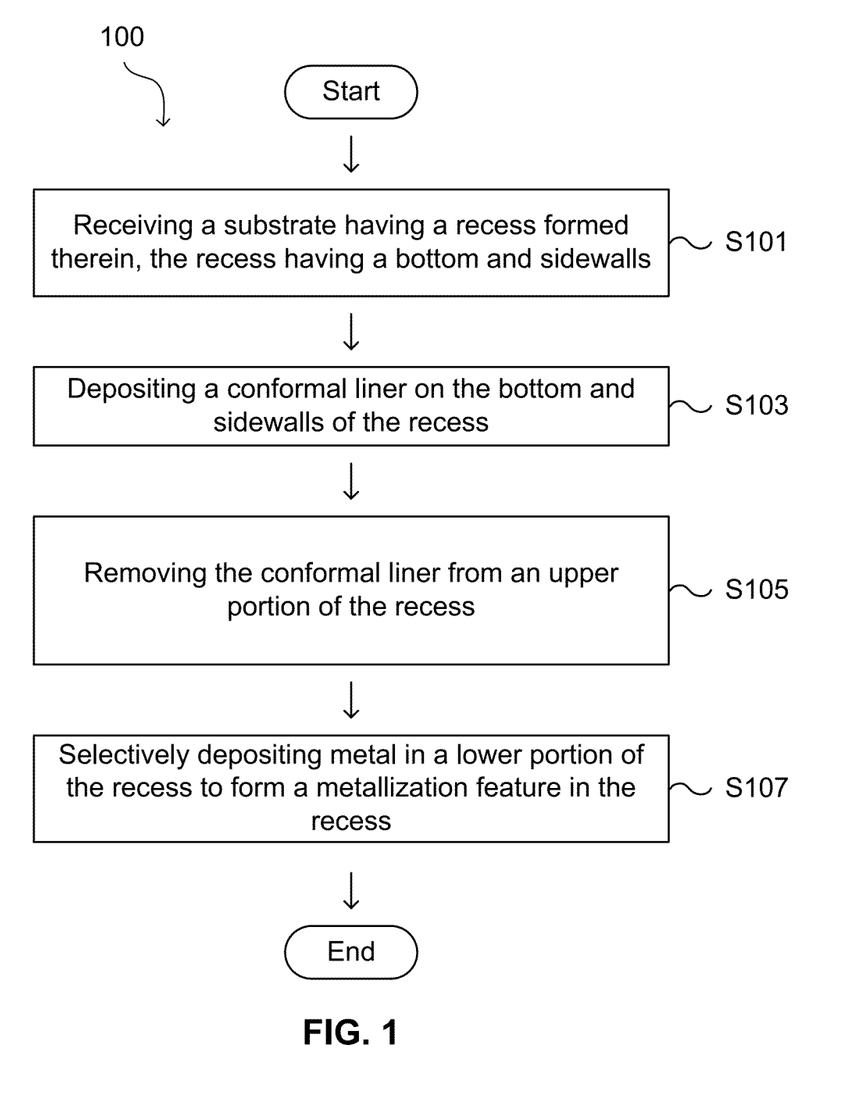
FIG. 1 is a flowchart of a bottom-up metallization process in accordance with embodiments of the present disclosure.

FIG. 1 is a flowchart of a bottom-up metallization process in accordance with embodiments of the present disclosure. As seen, the method includes step 101 of receiving a substrate having a recess formed therein, the recess having a bottom and sidewalls. In step 103, a conformal liner is deposited on the bottom and sidewalls of the recess. In step 105, the conformal liner is removed from an upper portion of the recess to expose upper sidewalls of the recess while leaving the conformal liner in a lower portion of the recess covering the bottom and lower sidewalls of the recess. In accordance with embodiments of this disclosure, the portion of the conformal layer may be removed either before or after deposition of metal as discussed further below. In step 107, a metal is selectively deposited in the lower portion of the recess to form a metallization feature that includes the conformal liner in the lower portion of the recess and the metal. In accordance with embodiments of this disclosure, the metal can be selectively deposited with or without the use of a self-assembled monolayer, as also discussed further below.

Compared with related examples where a top-down etching process is required to form a rail, bottom-up metallization herein can be performed without CMP, and can provide profile control of the top of a metal rail and reduce height variation from rail to rail. In particular, bottom-up metallization herein can flattening a top of the metal rail to mitigate problems associated with meniscus profiles.

Figure 2A:
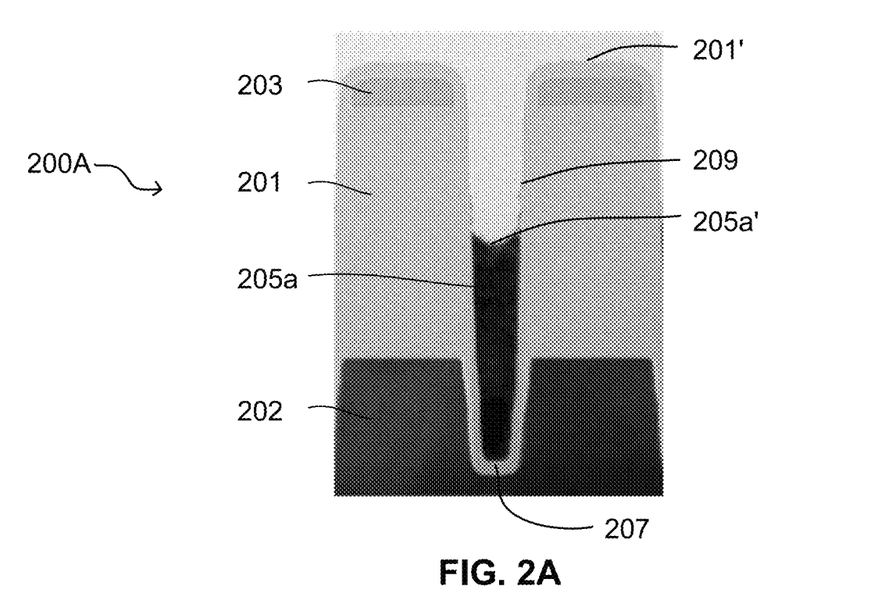
FIGS. 2A and 2B are images of a rail profile with a meniscus and without a meniscus, respectively, in accordance with exemplary embodiments of the disclosure.
Figure 2B:
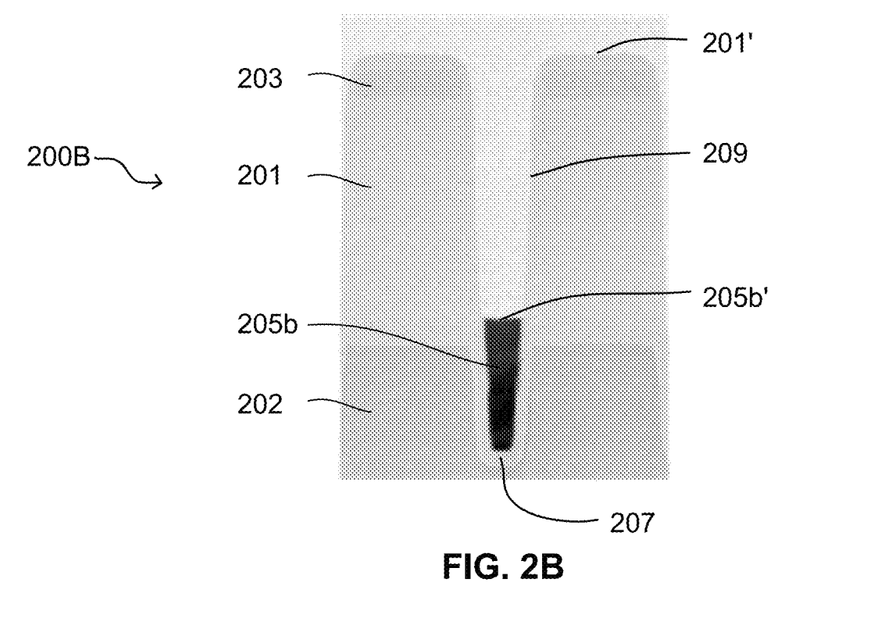

FIGS. 2A and 2B are magnified (TEM) cross-sectional images showing different rail profiles. As seen, FIG. 2A shows a rail profile with a meniscus in a device 200A, while FIG. 2B shows a rail profile without a meniscus in a device 200B. A rail without a meniscus is desired. In FIG. 2A, the device 200A can have a patterned first layer 201 and a second layer 202 below the first layer 201. The first layer 201 can have a recessed feature that extends into the second layer 202 and defines a bottom 207 and two sidewalls 209. The device 200A can further include a metal film 205a in the recessed feature, with a top surface 205a' of the metal film 205a below a top surface 201' of the first layer 201. The metal film 205a can cover the bottom 207 and portions of sidewalls 209 of the recessed feature. In some embodiments, the device 200A can also have a third layer 203 within the first layer 301.

Since the example embodiment of FIG. 2B is similar to the example embodiment of FIG. 2A, the explanation will be given with emphasis placed upon differences. Unlike the metal film 205a in FIG. 2A that can have a meniscus and be concave, a metal film 205b' in FIG. 2B can have a flat top surface 205b'. Note that metal films 205a and 205b can serve as buried power rails as illustrated in FIG. 9. For a buried power rail application, it is desirable for the top of a rail to have a flat topography. As noted, if instead the rail had a meniscus, then the result would be high electric fields at the peaks, which can cause device failure through electrostatic discharge. Additionally, a meniscus can compound the variability in distance between the top of the rail and the metallization above. Hence, the metal film 205b' can be desirable for a buried power rail application. Lastly, it should be understood that the height of the top surface 205b' of the metal film can be adjusted to meet specific design requirements.

Figure 3:
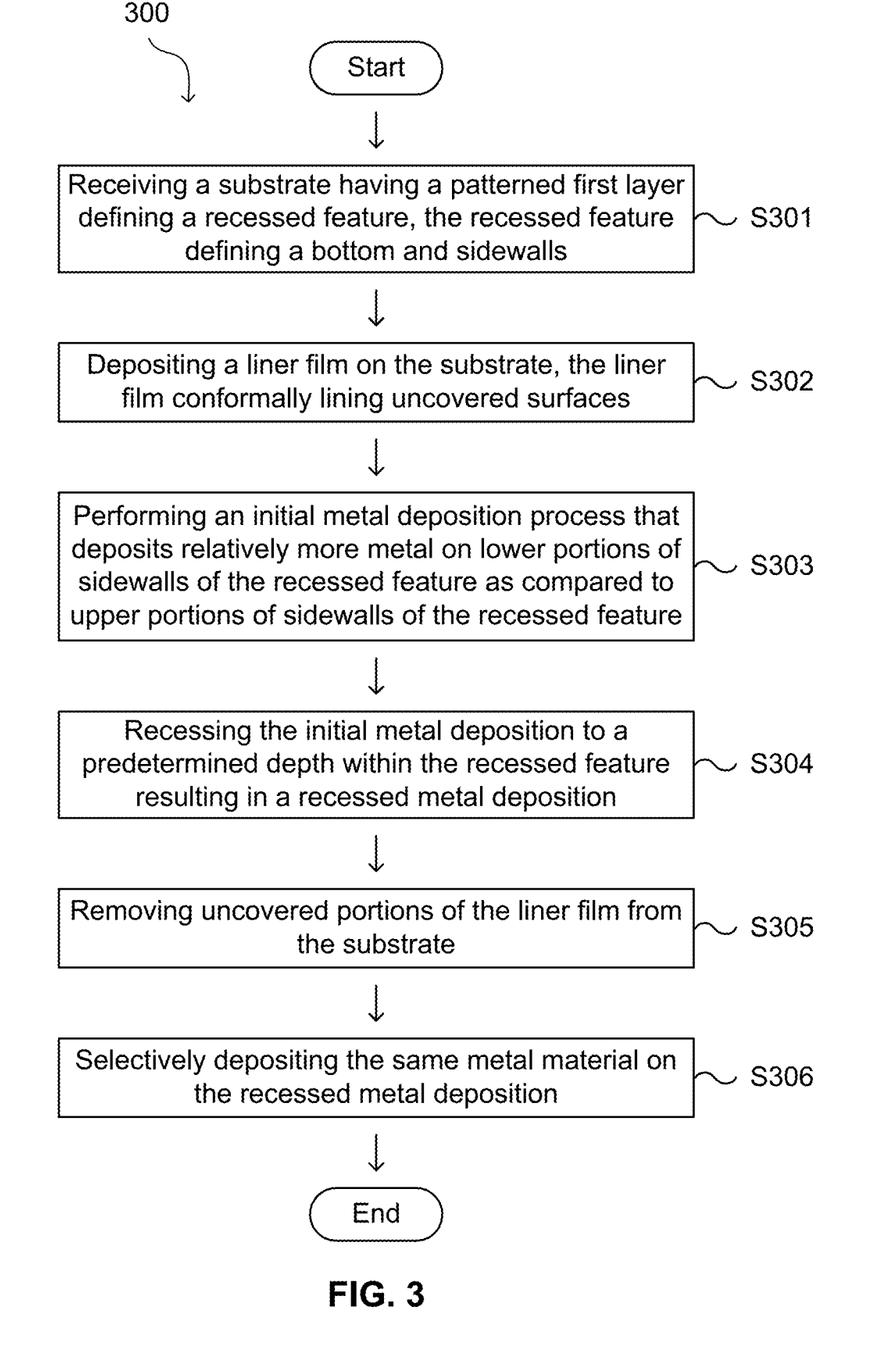
FIG. 3 is a flowchart of a bottom-up metallization process, in accordance with an example embodiment of the disclosure.

FIG. 3 is a flowchart of an exemplary process 300 for manufacturing an exemplary semiconductor device, in accordance with embodiment of the disclosure. The process 300 begins with step S301 where a substrate can be received with a patterned first layer and a second layer below the first layer. The first layer can have a recessed feature that extends into the second layer and defines a bottom and two sidewalls. In some embodiments, the substrate can have a first layer and a recessed feature within the first layer, defining a bottom and two sidewalls, without a second layer below the first layer. The process 300 then proceeds to step S302 where a liner film can be deposited conformally on uncovered surfaces of the substrate, including bottoms and sidewalls of the recessed feature and top surfaces of the first layer. At step S303, an initial metal deposition can be performed to deposit relatively more metal on lower portions of sidewalls of the recessed feature as compared to upper portions of sidewalls of the recessed feature. As a result, the bottom of the recessed feature can be filled with metal. Then at step S304, the initial metal deposition can be recessed to a predetermined depth within the recessed feature, resulting in a recessed metal deposition. Consequently, the initial metal deposition at upper portions of sidewalls of the recess and the top surfaces of the first layer can be removed. The remaining metal film can cover bottoms and lower portions of sidewalls of the recess. At step S305, uncovered portions of the liner film can be removed from the substrate. At step S306, the same metal material can be selectively deposited on the recessed metal deposition. Selective deposition of the metal material can be accomplished with or without a SAM, and can further include a cleaning step to remove non-selectively deposited metal. Moreover, the concavity of the top surface of the metal film can be controlled by tuning selective deposition time.

Figure 4A:
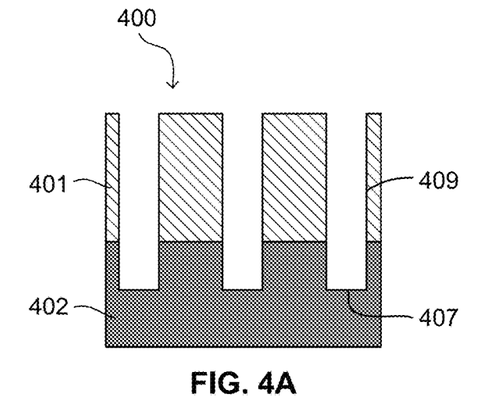
FIGS. 4A-4F are schematic cross-sections of a semiconductor device at various intermediate steps of manufacturing, in accordance with the example process of FIG. 3.

FIGS. 4A-4F are cross-sectional schematics of intermediate structures of a semiconductor device formed in accordance with the example process of FIG. 3. FIG. 4A shows a cross-sectional view of an exemplary semiconductor device 400. The device 400 can have a patterned first layer 401 and a second layer 402 below the first layer 401. The first layer 401 can have a recessed feature that extends into the second layer 402 and defines a bottom 407 and two sidewalls 409. The second layer 402 can be made of any semiconductor material, such as silicon, and may be bulk silicon material. The first layer 401 can be a dielectric material, such as silicon oxide. The recessed feature can be formed by directional etching using an etch mask to define regions to etch.

Figure 4B:
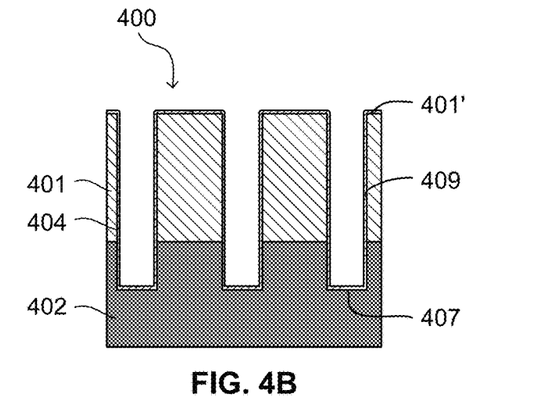

In FIG. 4B, a liner film 404 can then be deposited conformally on uncovered surfaces in the device 400 so that the liner film 404 covers top surfaces 401' of the first layer 401, bottoms 407 and sidewalls 409 of the recessed feature. The liner film 404 can be used for nucleation promotion/adhesion and may also serve as a barrier for material migration. The liner film 404 can be made of a different dielectric material from the first layer 401, such as tantalum nitride, titanium nitride, silicon oxide, silicon nitride, and silicon oxynitride, and can be deposited by any technique, such as atomic layer deposition or chemical vapor deposition.

Figure 4C:
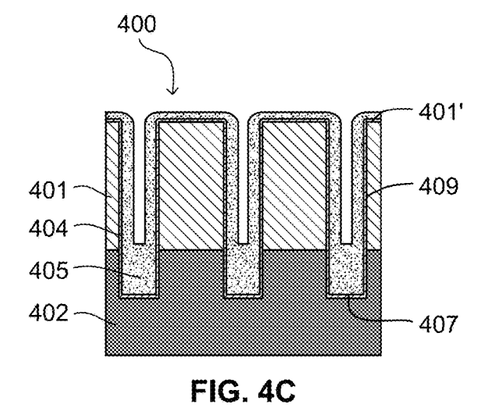

In FIG. 4C, a metal film 405 can be initially deposited somewhat conformally on the liner film 404 and fill bottoms 407 of the recessed feature, resulting in a relatively thicker deposition at the bottoms 407 and lower portions of sidewalls 409 of the recess and a relatively thinner deposition at the upper portions of sidewalls 409 of the recess and the top surfaces 401' of the first layer 401. For example, the metal film 405 can be ruthenium or cobalt and can be deposited by chemical vapor deposition or atomic layer deposition.

Figure 4D:
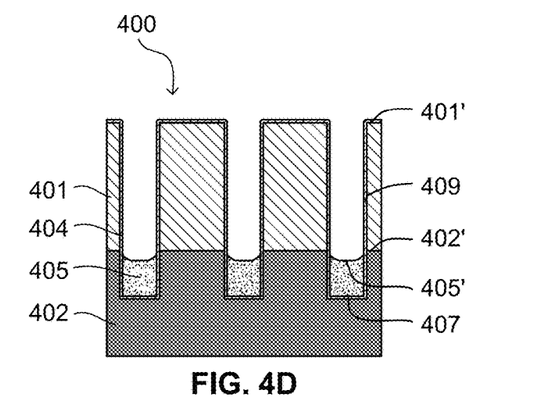

In FIG. 4D, the metal film 405 can then be recessed so that the initial metal deposition at the upper portions of sidewalls 409 of the recess and the top surfaces 401' of the first layer 401 is removed. Consequently, the remaining metal film 405 can cover bottoms 407 and lower portions of sidewalls 409 of the recess. Moreover, the remaining metal film 405 can have a concave top surface 405'. In this example, the top surface 405' of the metal film 405 can be lower than a top surface 402' of the second layer 402. The top surface 405' of the metal film 405 can, of course, be adjusted to meet specific design requirements. The metal removal can be accomplished by a dry or wet etching process. For example, an etchant can be selected so that the etchant only etches the metal layer 405 and does not etch the liner film 404. For example, the etchant can be a hot solution containing hydrochloride acid and nitric acid that etches ruthenium, but does not etch silicon nitride. Alternatively, reactive ion etch based on oxygen/chlorine/argon can be used for ruthenium removal. In an embodiment where the liner film 404 is made of titanium nitride, reactive ion etch based on oxygen/nitrogen may result in better selectivity.

Figure 4E:
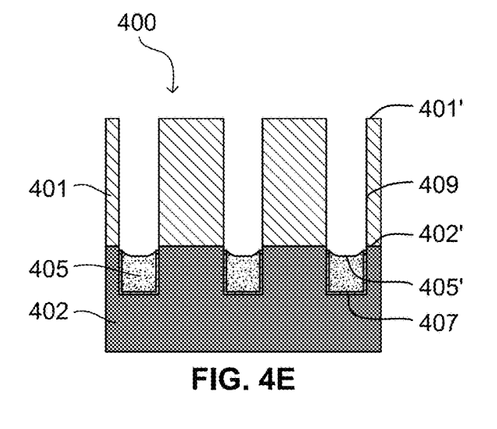

In FIG. 4E, uncovered portions of the liner film 404 can be removed by any technique such as dry etching or wet etching. An etchant can be selected so that the etchant only etches the liner film 404 and does not etch the metal layer 405 or the first layer 401. For example, the etchant can be a hot concentrated orthophosphoric acid solution that etches silicon nitride but does not etch ruthenium or silicon oxide. In the abovementioned embodiment where the liner film 404 is made of titanium nitride, SC1 wet etch can be used which is a mixture of ammonium hydroxide, hydrogen peroxide, and water. In another embodiment where the liner film 404 is tantalum nitride, this partially occurs during the dry etch of ruthenium ($O_2/Cl_2/Ar$) which can be followed by a wet etch step to remove any residues.

Figure 4F:
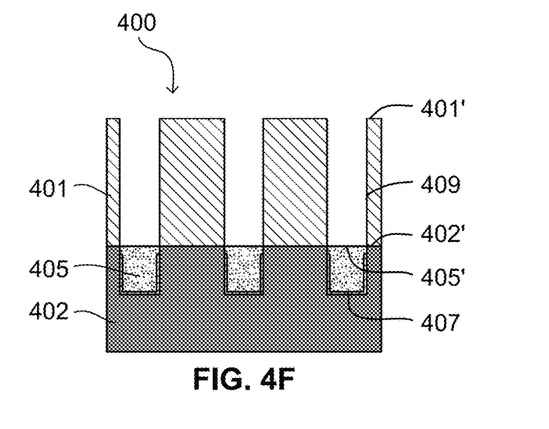

In FIG. 4F, the same metal material can be selectively deposited on the remaining metal film 405 in FIG. 4E so that the top surface 405' of the metal film 405 can be flattened. In some embodiments, selective deposition of the metal material can be achieved by using a self-assembled monolayer (SAM) to block metal deposition. A SAM can be selectively deposited on the uncovered portions of the first layer 401 so that the SAM can reduce or eliminate metal nucleation (not shown). Subsequently, a metal deposition process can be performed to selectively deposit the same metal on the remaining metal film 405. For example, an octadecyltrichlorosilane (ODTS) SAM can be selectively deposited on silicon nitride or oxide and prevent metal nucleation. Other common surface modification agents include but are not limited to: alkanethiols (such as DDT: dodecanethiol), alkylsilanes (such as ODTS: octadecyltrichlorosilane), alkylphosphonic acids (such as ODPA:

octadecylphosphonic acid), fluorocarbons (such as PFOTS: perfluorooctyltrichlorosilane), and silazanes (such as HMDS: hexamethyldisilizane and TMSDMA: trimethylsilane dimethylamine).

Figure 5A:
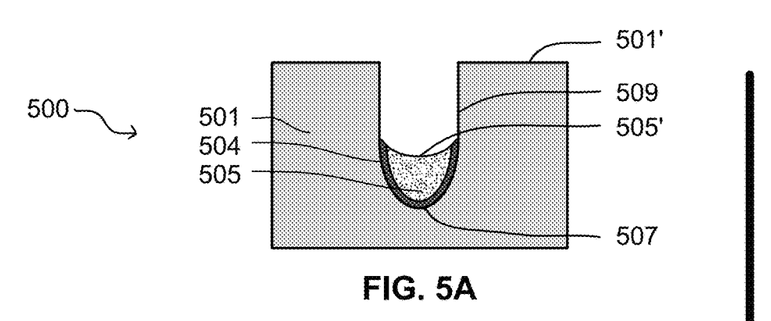
FIGS. 5A, 5B, and 5C are schematic representations of a rail profile as a function of selective deposition time, in accordance with exemplary embodiments of the disclosure.
Figure 5B:
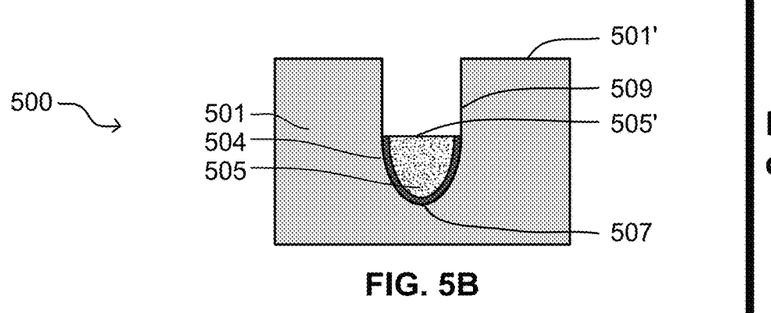
Figure 5C:
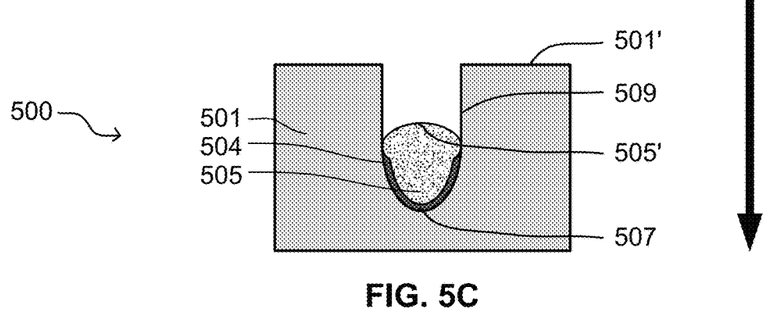

FIGS. 5A, 5B, and 5C show the rail profile as a function of selective deposition time, in accordance with exemplary embodiments of the disclosure. FIG. 5A shows a cross-sectional view of an exemplary device 500 corresponding to an intermediate state between FIG. 4E and FIG. 4F. The device 500 can have a first layer 501 and a recess in the first layer 501 that defines a bottom 507 and two sidewalls 509. The device 500 can also have a liner film 504 coating the bottom 507 and portions of sidewalls 509 of the recess. The device 500 can further include a metal film 505 covering the liner film 504. The metal film 505 can have a concave top surface 505' below a top surface 501' of the first layer 501. The first layer 501 can be silicon oxide, and the metal film 505 can be ruthenium or cobalt. While the first layer 501 is shown as a single layer in this example, in some embodiments, the first layer 501 can be a two-layer structure made of silicon oxide over silicon, similar to FIGS. 4E and 4F.

FIG. 5B shows the device 500 in FIG. 5A after increasing selective deposition time. As a result, the device 500 can have a flat top surface 505', similar to FIG. 4F.

FIG. 5C shows the device 500 in FIG. 5B after further increasing selective deposition time. Consequently, the top surface 505' of the metal film 505 can be rendered convex. Hence, the concavity of the top surface 505' of the metal film 505 can be controlled by tuning selective deposition time. With increasing deposition time, a concave surface can progress to a flat surface and then to a convex surface.

Figure 6A:
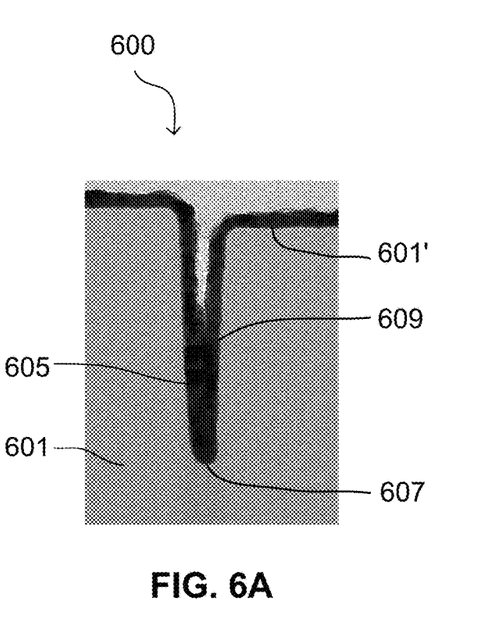
FIGS. 6A, 6B, and 6C are cross-sectional images of intermediate structures of a semiconductor device formed in accordance with the example process of FIG. 3.
Figure 6B:
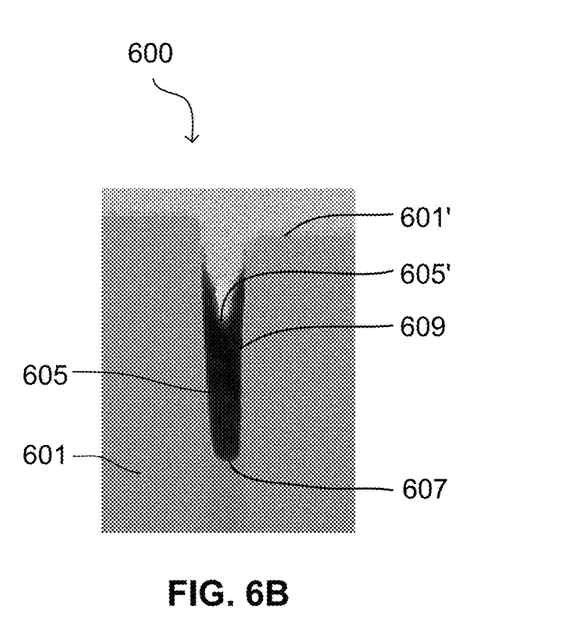
Figure 6C:
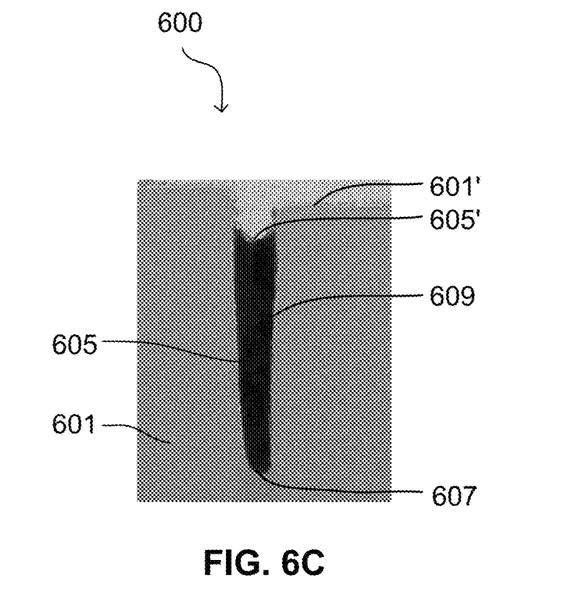

FIGS. 6A, 6B, and 6C are cross-sectional images of a semiconductor device formed in accordance with the example process of FIG. 3. FIG. 6A shows a cross-sectional view of an exemplary device 600. The device 600 has a first layer 601 and a recess in the first layer 601 that defines a bottom 607 and two sidewalls 609. The device 600 also has a liner film conformally coating the first layer 601 (not visible due to scale). The device 600 further includes a metal film 605 that is deposited somewhat conformally on the liner film and fills the bottom 607 of the recess. The metal film 605 is relatively thicker at the bottom 607 and lower portions of sidewalls 609 of the recess than at the upper portions of sidewalls 609 of the recess and top surfaces 601' of the first layer 601. In the example embodiment shown, the first layer 601 is silicon oxide, and the metal film 605 is ruthenium. While the first layer 601 is shown as a single layer in this example, in some embodiments, the first layer 601 can be a two-layer structure made of silicon oxide over silicon, similar to FIG. 4C.

FIG. 6B shows the device 600 in FIG. 6A after recessing the metal film 605. The metal film 605 at the upper portions of sidewalls 609 of the recess and top surfaces 601' of the first layer 601 is removed. Consequently, the remaining metal film 605 covers the bottom 607 and lower portions of sidewalls 609 of the recess. Moreover, the remaining metal film 605 has a concave top surface 605'. Recessing the metal film 605 can be accomplished by RIE or a wet etching process. For example, the etchant can be a hot solution containing hydrochloride acid (HCl) and nitric acid ($HNO_3$) that etches ruthenium, but does not etch silicon nitride or silicon oxide. Alternatively, RIE based on oxygen/chlorine/argon can remove ruthenium with no or minimal damage to the dielectric material 601.

FIG. 6C shows the device 600 of FIG. 6B after removing uncovered portions of the liner film and selectively depositing the same metal over the remaining metal film 605. The uncovered portions of the liner film can be removed by any technique such as dry etching or wet etching (not shown). For example, hot concentrated orthophosphoric acid can etch silicon nitride and does not etch ruthenium. In the abovementioned embodiment where the liner film 404 is made of titanium nitride, SC1 wet etch can be used which is a mixture of ammonium hydroxide, hydrogen peroxide, and water. In another embodiment where the liner film 404 is tantalum nitride, this partially occurs during the dry etch of ruthenium ($O_2/Cl_2/Ar$) which can be followed by a wet etch step to remove any residues. Selective deposition can be accomplished with or without a SAM, similar to FIG. 4F. As a result, the concavity of the top surface 605' of the metal film 605 can be reduced. Further, the concavity of the top surface 605' of the metal film 605 can be controlled by tuning selective deposition time.

In an alternative embodiment, selective deposition of the metal material can be achieved by using a SAM to promote or induce metal deposition. A SAM can be selectively deposited on the top surface 405' of the metal layer 405 so that the SAM can serve as a precursor for metal deposition (not shown). Subsequently, a metal deposition process can be performed to selectively deposit the same metal on the remaining metal film 405. Moreover, in some embodiments, selective deposition of the metal material can be achieved without using a SAM. A metal deposition process can be performed that has inherent selectivity to the remaining metal film 405.

Note that some metal material can be non-selectively deposited on unintended surfaces to some extent during selective deposition (not shown). Hence, a cleaning process can be performed after metal deposition to remove metal that is non-selectively deposited on uncovered portions of the first layer 401. Additionally, the top surface 405' of the metal film 405 can be on a same level as the top surface 402' of the second layer 402 in the FIG. 4F example. It is understood that the top surface 405' of the metal film 405 can be adjusted to meet specific design requirements.

Figure 7:
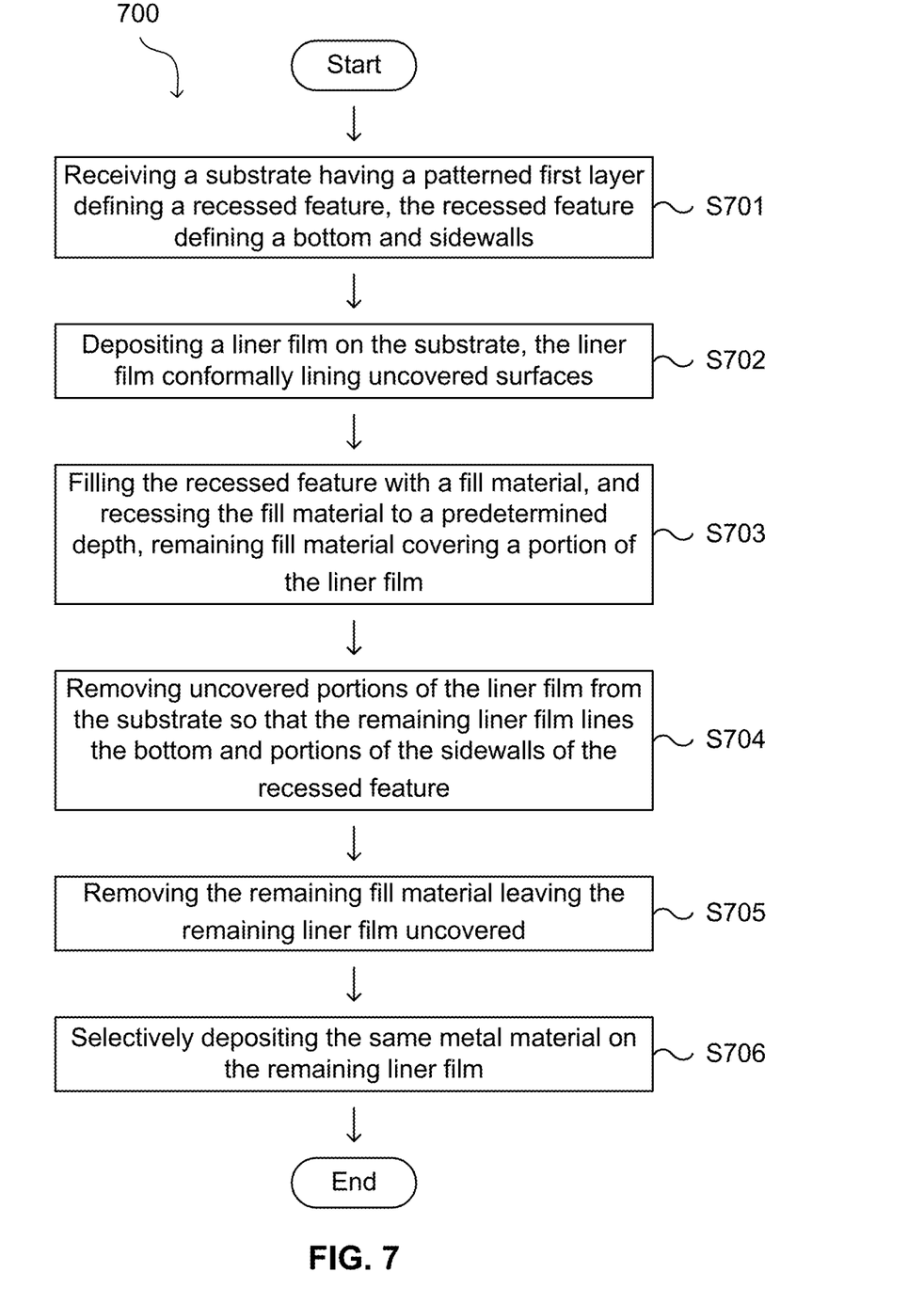
FIG. 7 is a flowchart of a bottom-up metallization process, according to another example embodiment of the disclosure.

FIG. 7 is a flowchart of an alternative process 700 for manufacturing an exemplary semiconductor device, corresponding to the process illustrated in FIGS. 7A-7G. The process 700 begins with step S701 where a substrate can be received with a patterned first layer and a second layer below the first layer. The first layer can have a recessed feature that extends into the second layer and defines a bottom and two sidewalls. In some embodiments, the substrate can have a first layer and a recessed feature within the first layer, defining a bottom and two sidewalls, without a second layer below the first layer. The process 800 then proceeds to step S702 where a liner film can be deposited conformally on uncovered surfaces of the substrate, including bottoms and sidewalls of the recessed feature and top surfaces of the first layer. At step S703, the recessed feature can be filled with a fill material, and the fill material can then be recessed to a predetermined depth so that the remaining fill material covers a portion of the liner film. At step S704, uncovered portions of the liner film can be removed from the substrate so that the remaining liner film lines the bottom and portions of the sidewalls of the recessed feature. At step S705, the remaining fill material can be removed to leave the remaining liner film uncovered. At step S706, the same metal material can be selectively deposited on the remaining liner film. Selective deposition of the metal material can be accomplished with or without a SAM, and can further include a cleaning step to remove non-selectively deposited metal. Moreover, the concavity of the top surface of the metal film can be controlled by tuning selective deposition time FIGS. 8A-8G are cross-sectional schematics of intermediate structures of a semiconductor device formed in accordance with the example process of FIG. 7. FIGS. 4A-4F show a process flow when a liner film is removed after metal recess but before selective metal deposition. The alternative embodiment in FIGS. 8A-8G shows a process flow where the liner film can be removed before any metal deposition.

Figure 8A:
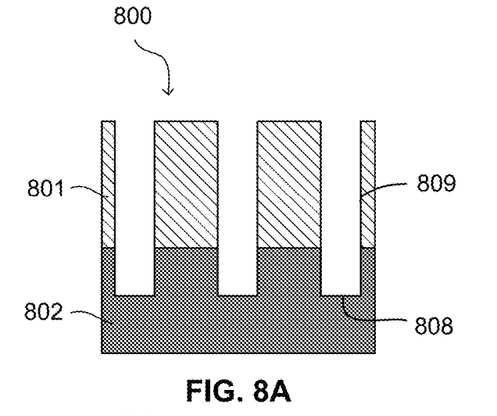
FIGS. 8A-8G are schematic cross-sections of a semiconductor device at various intermediate steps of manufacturing, in accordance with the example process of FIG. 7.

FIG. 8A shows a cross-sectional view of a semiconductor device 800 similar to the device 400 in FIG. 4A. The device 800 can have a patterned first layer 801 and a second layer 802 below the first layer 801. The first layer 801 can have a recessed feature that extends into the second layer 802 and defines a bottom 807 and two sidewalls 809. The second layer 802 can be made of any semiconductor material, such as silicon. The first layer 801 can be a dielectric material, such as silicon oxide. The recessed feature can be formed by directional etching using an etch mask to define regions to etch.

Figure 8B:
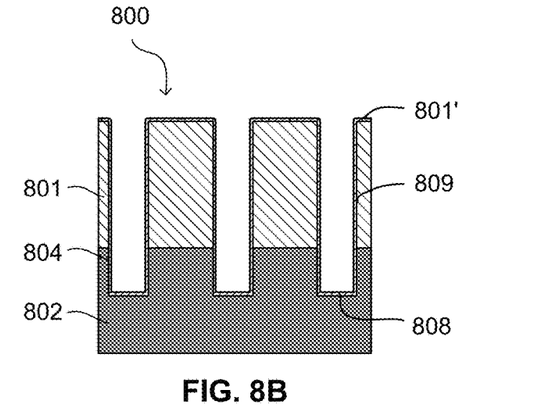

FIG. 8B shows the device 800 in FIG. 8A after liner deposition, similar to the device 400 in FIG. 4B. A liner film 804 can be deposited conformally on uncovered surfaces in the device 800 so that the liner film 804 covers top surfaces 801' of the first layer 801, bottoms 807 and sidewalls 809 of the recessed feature. The liner film 804 can provide electrical isolation and serve as a barrier for material migration. The liner film 804 can be made of a dielectric material, such as silicon nitride, and can be deposited by any technique, such as atomic layer deposition or chemical vapor deposition.

Figure 8C:
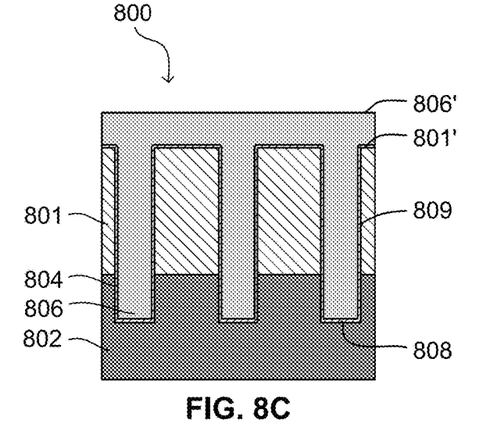

FIG. 8C shows the device 800 in FIG. 8B after depositing a fill material 806, unlike what is shown in FIG. 4C. In this example, the fill material 806 can fully fill the recessed feature and have a top surface 806' above the top surface 801' of the first layer 801. In an alternative embodiment, the fill material 806 can fully fill the recessed feature and have the top surface 806' on a same level as the top surface 801' of the first layer 801. In some embodiments, the fill material 806 can partially fill the recessed feature and have the top surface 806' below the top surface 801' of the first layer 801. The fill material 806 can be any material that is different from the liner film 804 and the first layer 801, and be deposited by any technique. For example, the fill material 806 can be polysilicon deposited by chemical vapor deposition. Additionally, a chemical mechanical planarization process can be used to render the top surface 806' of the fill material 806 flat.

Figure 8D:
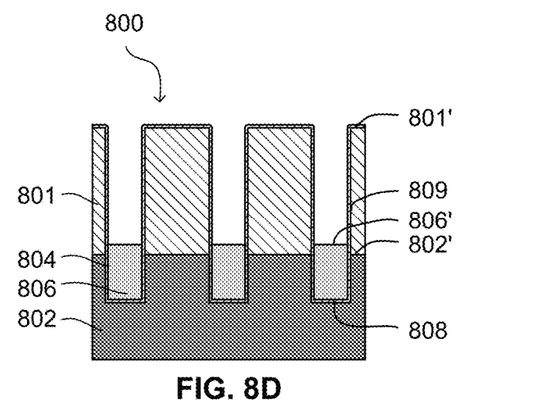

FIG. 8D shows the device 800 in FIG. 8C after recessing the fill material 806 to a predetermined depth. Consequently, the remaining fill material 806 can cover the bottom 807 and portions of sidewalls 809 of the recessed feature. In this example, the top surface 806' of the remaining fill material 806 can be above a top surface 802' of the second layer 802. In some embodiments, the top surface 806' of the remaining fill material 806 can be on a same level as or below the top surface 802' of the second layer 802. Note that the top surface 806' of the remaining fill material 806 can be adjusted to meet specific design requirements. For example, the top surface 806' of the remaining fill material 806 can be a desired top surface of a power rail or at an interface between silicon oxide and silicon. Additionally, recessing the fill material 806 can be accomplished by any technique such as dry or wet etching. An etchant can be selected so that the etchant etches the fill material 806, but does not etch the liner film 804. For example, the etchant can be a solution containing tetramethylammonium hydroxide that etches polysilicon, but does not etch silicon nitride. In an embodiment where the fill material 806 is a spin on carbon type film, then $O_2/CO_2$/He based dry etch can be used for selective etch back of this material.

Figure 8E:
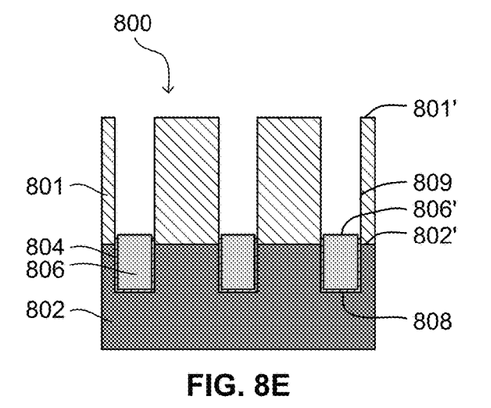

FIG. 8E shows the device 800 in FIG. 8D after removing uncovered portions of the liner film 804. The remaining liner film 804 can cover the bottom 807 and portions of sidewalls 809 of the recessed feature. The removal of uncovered portions of the liner film 804 can be accomplished by any technique such as wet etching. An etchant can be selected so that the etchant etches the liner film 804, but does not etch the first layer 801 or the fill material 806. For example, the etchant can be a hot concentrated orthophosphoric acid solution that etches silicon nitride, but does not etch silicon oxide or polysilicon.

Figure 8F:
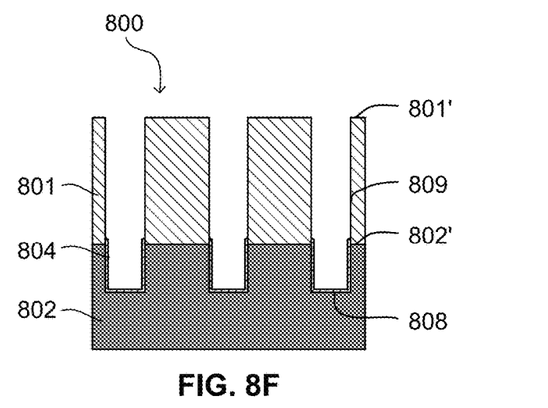

FIG. 8F shows the device 800 in FIG. 8E after removing the remaining fill material 806 so as to leave the remaining liner film 804 uncovered. The removal of the fill material 806 can be accomplished by any technique such as wet etching. An etchant can be selected so that the etchant etches the fill material 806, but does not etch the liner film 804 or the first layer 801. For example, the etchant can be a solution containing tetramethylammonium hydroxide that etches polysilicon, but does not etch silicon nitride or silicon oxide.

Figure 8G:
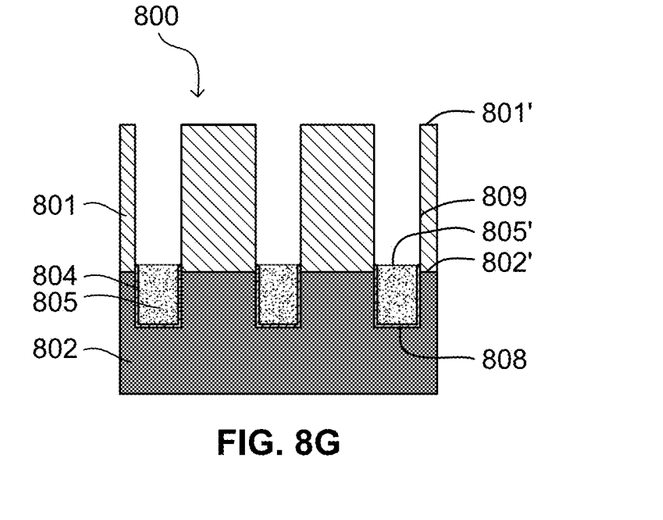

FIG. 8G shows the device 800 in FIG. 8F after selective deposition of the metal on the remaining line film 804. Similar to FIG. 4F, selective deposition can be achieved with or without a SAM, and a subsequent cleaning process can be performed after selective deposition to remove non-selective metal deposition. The explanation will therefore be given with emphasis placed upon differences. In this example, a top surface 805' of the metal film 805 can be above the top surface 802' of the second layer 802. In some embodiments, the top surface 805' of the metal film 805 can be on a same level as or below the top surface 802' of the second layer 802. The top surface 805' of the metal film 805 can be adjusted to meet specific design requirements. Further, the concavity of the top surface 805' of the metal film 805 can be controlled by tuning selective deposition time as shown in FIGS. 6A, 6B, and 6C.

The various embodiments described herein offer several advantages over related manufacturing processes. For example, bottom-up metallization can greatly shorten a required metal recess time and eliminate a need for a chemical mechanical planarization step. The disclosed processes can also provide profile control of the top of a metal rail and reduce height variation from rail to rail.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of metallization, the method comprising:
   receiving a substrate having a recess formed therein, the recess having a bottom and sidewalls;
   depositing a conformal liner on the bottom and sidewalls of the recess;
   removing the conformal liner from an upper portion of the recess to expose upper sidewalls of the recess while leaving the conformal liner in a lower portion of the recess covering the bottom and lower sidewalls of the recess; and
   selectively depositing a metal in the lower portion of the recess to form a metallization feature comprising the conformal liner in the lower portion of the recess and the metal, wherein the selectively depositing the metal comprises depositing a self-assembled monolayer only over the conformal liner and depositing a metal only on the self-assembled monolayer, the self-assembled monolayer being a precursor for metal nucleation.

2. The method of claim 1, wherein said removing the conformal liner comprises:
   depositing a material to cover the conformal liner in the lower portion of the recess; and
   selectively etching the conformal liner from the upper portion of the recess relative to the material covering the conformal liner in the lower portion of the recess.

3. The method of claim 2, wherein the depositing a material comprises depositing either a metal that will form a portion of the metallization feature in the lower portion of the recess, or depositing a blocking material that will not form a portion of the metallization feature in the lower portion of the recess.

4. The method of claim 1, further comprising surface treating the exposed upper sidewalls of the recess with a self-aligning monolayer to facilitate selective deposition of the metal relative to the exposed sidewalls.

5. A method of processing a substrate, the method comprising:
   receiving a substrate having a patterned first layer defining a recessed feature, the recessed feature defining a bottom and sidewalls;
   depositing a liner film on the substrate, the liner film conformally lining uncovered surfaces;
   performing an initial metal deposition process that deposits a metal relatively more on lower portions of sidewalls of the recessed feature as compared to upper portions of sidewalls of the recessed feature;
   recessing the initial metal deposition to a predetermined depth within the recessed feature resulting in a recessed metal deposition;
   removing uncovered portions of the liner film from the substrate while leaving covered portions of the liner film covering the bottom and lower sidewalls of the recess; and
   selectively depositing the metal on the recessed metal deposition by an area-selective deposition process that deposits the metal only on the recessed metal deposition relative to the rest of the substrate.

6. The method of claim 5, wherein the area-selective deposition process fills gaps in the recessed metal deposition.

7. The method of claim 5, wherein the area-selective deposition process changes a cross-sectional profile of the recessed metal deposition by reducing concavity of the cross-sectional profile.

8. The method of claim 5, wherein the substrate further comprises a second layer below the first layer, the first layer having the recessed feature extending into the second layer.

9. The method of claim 8, wherein:
   the first layer is a dielectric material; and
   the second layer is a semiconductor material.

10. The method of claim 9, wherein:
    the first layer is silicon oxide; and
    the second layer is silicon.

11. The method of claim 5, wherein the area-selective deposition process comprises:
    depositing a self-assembled monolayer directly on uncovered portions of the first layer, the self-assembled monolayer reducing metal nucleation on the first layer; and
    performing a metal deposition process, the metal selectively depositing on the recessed metal deposition.

12. The method of claim 5, wherein the area-selective deposition process comprises:
    depositing a self-assembled monolayer directly over the recessed metal deposition, the self-assembled monolayer being a precursor for metal nucleation; and
    performing a metal deposition process, the metal selectively depositing on the recessed metal deposition.

13. The method of claim 5, further comprising:
    cleaning the substrate to remove metal that is non-selectively deposited on uncovered portions of the first layer.

14. A method of processing a substrate, the method comprising:
    receiving a substrate having a patterned first layer defining a recessed feature, the recessed feature defining a bottom and sidewalls;
    depositing a liner film on the substrate, the liner film conformally lining uncovered surfaces;
    filling the recessed feature with a fill material and recessing the fill material to a predetermined depth, remaining fill material covering a portion of the liner film;

removing uncovered portions of the liner film from the substrate so that the remaining liner film lines the bottom and portions of sidewalls of the recessed feature;

removing the remaining fill material, leaving the remaining liner film uncovered; and selectively depositing a metal over the remaining liner film by an area-selective deposition process that deposits the metal only on the remaining liner film relative to the rest of the substrate, wherein the area-selective deposition process comprises depositing a self-assembled monolayer only over the remaining liner film and depositing the metal only on the self-assembled monolayer, the self-assembled monolayer being a precursor for metal nucleation.

15. The method of claim 14, wherein the substrate further comprises a second layer below the first layer, the first layer having the recessed feature extending into the second layer.

16. The method of claim 15, wherein:
the first layer is a dielectric material; and
the second layer is a semiconductor material.

17. The method of claim 16, wherein:
the first layer is silicon oxide; and
the second layer is silicon.

18. The method of claim 14, wherein the area-selective deposition process comprises:
depositing a self-assembled monolayer directly on uncovered portions of the first layer, the self-assembled monolayer reducing metal nucleation on the first layer; and
performing a metal deposition process, the metal selectively depositing on the remaining liner film.

19. The method of claim 14, further comprising:
cleaning the substrate to remove metal that is non-selectively deposited on uncovered portions of the first layer.

* * * * *